(12) United States Patent
Kallikuppa et al.

(10) Patent No.: US 10,871,757 B2
(45) Date of Patent: Dec. 22, 2020

(54) BINARY DIGITAL INPUT MODULE HAVING COMPARATOR AND ISOLATED OUTPUT

(71) Applicant: Texas Instruments Incorporated, Dallas, TX (US)

(72) Inventors: Sreenivasa Muniyappa Kallikuppa, Bangalore (IN); Amit G. Kumbasi, Allen, TX (US); Prasanna Udupi Rajagopal, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 169 days.

(21) Appl. No.: 16/134,443

(22) Filed: Sep. 18, 2018

(65) Prior Publication Data

US 2020/0089183 A1  Mar. 19, 2020

(51) Int. Cl.
| | | |
|---|---|---|
| *H03M 1/00* | (2006.01) | |
| *G05B 19/05* | (2006.01) | |
| *G05B 9/02* | (2006.01) | |
| *G05B 19/042* | (2006.01) | |
| *H03M 1/12* | (2006.01) | |

(52) U.S. Cl.
CPC ............. *G05B 19/058* (2013.01); *G05B 9/02* (2013.01); *G05B 19/0425* (2013.01); *G05B 19/0428* (2013.01); *G05B 2219/2612* (2013.01); *H03M 1/1205* (2013.01)

(58) Field of Classification Search
CPC .......... H03M 7/10; H03M 1/12; H03M 1/123; H03M 1/188; H03M 3/398; H03M 3/452; H03M 5/12; H03M 1/0604; H03M 1/48; H03M 3/362; H03M 3/364; H03M 3/368; H03M 3/43; H02M 3/07; H02M 2003/075; H02M 1/08; H02M 2001/0025; H02M 3/33515; H02M 1/36; H02M 2001/0009; H02M 2001/0032; H02M 2001/0045; H02M 2001/007; H02M 3/073
USPC ............................ 341/159, 164, 165, 139–42
See application file for complete search history.

(56) References Cited

U.S. PATENT DOCUMENTS

| | | | | |
|---|---|---|---|---|
| 4,933,869 | A | 6/1990 | Gareis | |
| 5,751,234 | A * | 5/1998 | Schlotterer | ........... H03M 1/186 341/139 |
| 8,462,003 | B2 * | 6/2013 | Ng | ........... H05B 45/10 340/635 |
| 8,477,856 | B2 * | 7/2013 | Gaalaas | ........... H04L 25/4917 375/258 |
| 9,520,920 | B2 * | 12/2016 | Ng | ........... H04B 5/005 |
| 9,531,280 | B2 * | 12/2016 | Peng | ........... G01R 31/2836 |

(Continued)

FOREIGN PATENT DOCUMENTS

CN  106292436 A  1/2017

OTHER PUBLICATIONS

International Search Report dated Dec. 19, 2019.

*Primary Examiner* — Linh V Nguyen
(74) *Attorney, Agent, or Firm* — Lawrence J. Bassuk; Charles A. Brill; Frank D. Cimino

(57) ABSTRACT

A binary/digital input module implemented on an integrated circuit (IC) chip has a plurality of input channels and includes, for each input channel, a comparator coupled to receive a scaled input voltage and a scaled threshold voltage and further coupled to provide an output value and a digital isolation circuit for data coupled between the comparator and a respective output pin to provide the output value across an isolation barrier.

19 Claims, 5 Drawing Sheets

(56) References Cited

U.S. PATENT DOCUMENTS

| | | | |
|---|---|---|---|
| 9,621,383 B1 | 4/2017 | Urienza | |
| 2005/0160334 A1* | 7/2005 | Kabune | H03M 1/1076 714/724 |
| 2006/0232461 A1* | 10/2006 | Felder | H03M 1/462 341/161 |
| 2008/0204289 A1* | 8/2008 | Miettinen | H03M 3/474 341/141 |
| 2012/0212362 A1* | 8/2012 | Ebata | H03M 1/1076 341/155 |

\* cited by examiner

BINARY DIGITAL INPUT MODULE HAVING COMPARATOR AND ISOLATED OUTPUT

FIELD OF THE DISCLOSURE

Disclosed embodiments relate generally to the field of binary input modules and digital input modules (collectively referred to herein as input modules) with outputs isolated from the input voltages that are being monitored. More particularly, and not by way of any limitation, the present disclosure is directed to a binary/digital input module having a comparator and an isolated output.

BACKGROUND

Both grid infrastructure and factory automation equipment utilize equipment such as protection relays, terminal units and programmable logic controllers to monitor and control conditions in various elements of the grid or factory infrastructure. One element of these is an input module that can be known as either a binary input module or a digital input module. Examples of the uses for these input modules can include substation battery monitoring, bay or substation primary equipment interlocking, breaker status indications, general interrogations, light emitting diode (LED) tests, fault indication, e.g., an alarm, and configuration changes, i.e., providing a new input module with new settings to perform different functionality. The input modules are installed as a part of the equipment that is connected across the primary asset that is generating, transmitting, and distributing power and are used to protect the asset against faults that can cause damage. The output levels from the input modules, whether binary or digital, indicate the status of the voltage being monitored and allow implementation of a protection algorithm. As will be explained below, many older systems require large circuit boards utilizing discrete components that must be physically switched out in order to alter the conditions being monitored. Although some improvements have been made to earlier input modules, more improvements are highly desirable.

SUMMARY

Disclosed embodiments provide an input module implemented on an integrated circuit (IC) chip that provides flexibility and easily updated configuration control while maintaining the necessary voltage isolation. The input module can be configured as a binary input module that provides a binary (high or low) output value, as a digital input module that provides a digital output value, or as an input module that can be programmed to provide binary and/or digital output values. For the purposes of this application, a binary/digital input module can refer to any one of these configurations or collectively to all of the configurations.

An on-chip comparator receives an input voltage and provides an output value that can be either a binary result of a comparison to a threshold or else a value of the input voltage. The output value is provided across a digital isolation circuit for data to an output pin that can be coupled to a microprocessor. The binary/digital input module can be configured to accept only direct current (DC) inputs, i.e., reject alternating current (AC), or to accept both AC and DC; input voltages can be selected from a wide range of voltages, which are typically in the ranges of 5V, 12V, 24V, 48V, 110V, 220V and 300V. The circuits in the binary/digital input module operate on 5.0V or below, so the inputs are first scaled down to an appropriate range for processing.

The user can select an input type (AC/DC or DC only), an output type (binary and/or digital) and a required voltage range, as well as specifying a programmable threshold for detection when the binary/digital input module is providing binary outputs. Each of the allowable selections can be provided using either an external switch coupled to a pin on the IC chip or through programming a register associated with the selection using a digital interface to the IC chip. Rather than requiring hours of work, configuration changes can be managed in minutes. Diagnostic capabilities are provided in the binary/digital input module to determine when a) voltage inputs do not match their specified input range, b) an AC voltage is coupled when DC only is specified, c) a DC connection is coupled with reversed polarities, d) a pin on the chip is accidently shorted to another pin, or e) an operational problem develops in the internal circuits. In addition to providing an alert for the conditions, potential damage caused by a, b, and c is avoided.

In one aspect, an embodiment of a binary/digital input module implemented on an integrated circuit chip is disclosed, the binary/digital input module having a plurality of input channels. For each input channel, the binary/digital input module includes a comparator coupled to receive a scaled input voltage and a scaled threshold voltage and further coupled to provide an output value; and a digital isolation circuit for data coupled between the comparator and a respective output pin to provide the output value across an isolation barrier.

BRIEF DESCRIPTION OF THE DRAWINGS

Embodiments of the present disclosure are illustrated by way of example, and not by way of limitation, in the figures of the accompanying drawings in which like references indicate similar elements. It should be noted that different references to "an" or "one" embodiment in this disclosure are not necessarily to the same embodiment, and such references may mean at least one. Further, when a particular feature, structure, or characteristic is described in connection with an embodiment, it is submitted that it is within the knowledge of one skilled in the art to effect such feature, structure, or characteristic in connection with other embodiments whether or not explicitly described. As used herein, the term "couple" or "couples" is intended to mean either an indirect or direct electrical connection unless qualified as in "communicably coupled" which may include wireless connections. Thus, if a first device couples to a second device, that connection may be through a direct electrical connection, or through an indirect electrical connection via other devices and connections.

The accompanying drawings are incorporated into and form a part of the specification to illustrate one or more exemplary embodiments of the present disclosure. Various advantages and features of the disclosure will be understood from the following Detailed Description taken in connection with the appended claims and with reference to the attached drawing figures in which:

DETAILED DESCRIPTION OF THE DRAWINGS

Specific embodiments of the invention will now be described in detail with reference to the accompanying figures. In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

Figure 2:
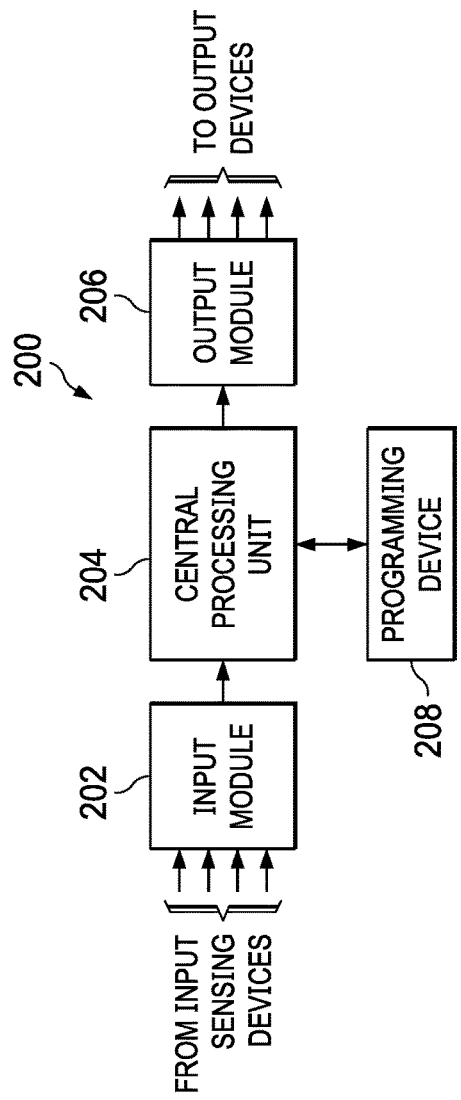
FIG. 2 depicts an implementation of a programmable logic control (PLC) system, which can be a protection relay, in which a binary/digital input module according to an embodiment of the disclosure can be utilized.

FIG. 2 depicts a programmable logic control system 200 that can include a binary/digital input module according to an embodiment of the disclosure. PLC system 200 provides programmable logic control for monitoring power control in factory automation and/or grid infrastructure, i.e., transmission lines, transformers and bus bars. PLC system 200 includes an input module 202 that is coupled to receive input from sensing devices, central processing unit (CPU) 204, which can be a microprocessor, output module 206, which is coupled to output devices such as circuit breakers, and programming device 208. Input module 202 performs four basic tasks in PLC system 200: a) sensing when a signal is received, b) conversion of the input voltage to the correct voltage level for use by the microprocessor, c) isolation of the microprocessor from fluctuation in the input signal voltage or current, and d) sending the signal to the microprocessor.

CPU 204 is the brains of the system, with input module 202 monitoring the inputs, yet isolating their effects from CPU 204. In one implementation, input module 202 can detect when an input crosses a threshold and provide that information to the CPU and may also provide alerts, e.g., visual or auditory outputs when the threshold is crossed. In an alternate implement, input module 202 provides digital values that can be received and acted upon by other devices. CPU 204 receives the outputs of input module 202 and makes a determination of the appropriate response, which can be to throw a circuit breaker or otherwise isolate or manage a potentially damaging condition.

The determinations made by CPU 204 can be used to provide directions to output module 206. Output module 206 transforms the directions from CPU 204 into specific operations performed by the output devices. In one example embodiment the output devices (not specifically shown) can include one or more of an electrical heater, lights, a solenoid valve, relays, a buzzer, a fan, etc. Programming device 208 can include a keyboard and monitor that are utilized to program the other elements of PLC 200.

Figure 3A:
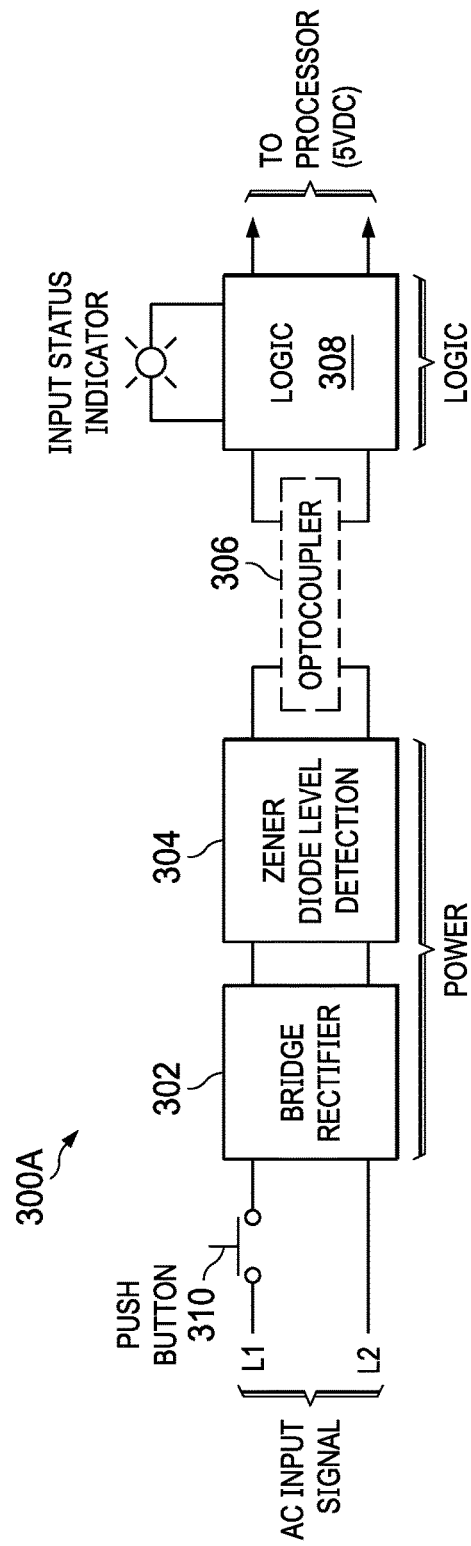
FIG. 3A depicts an block diagram of a binary input module according to the prior art.
Figure 3B:
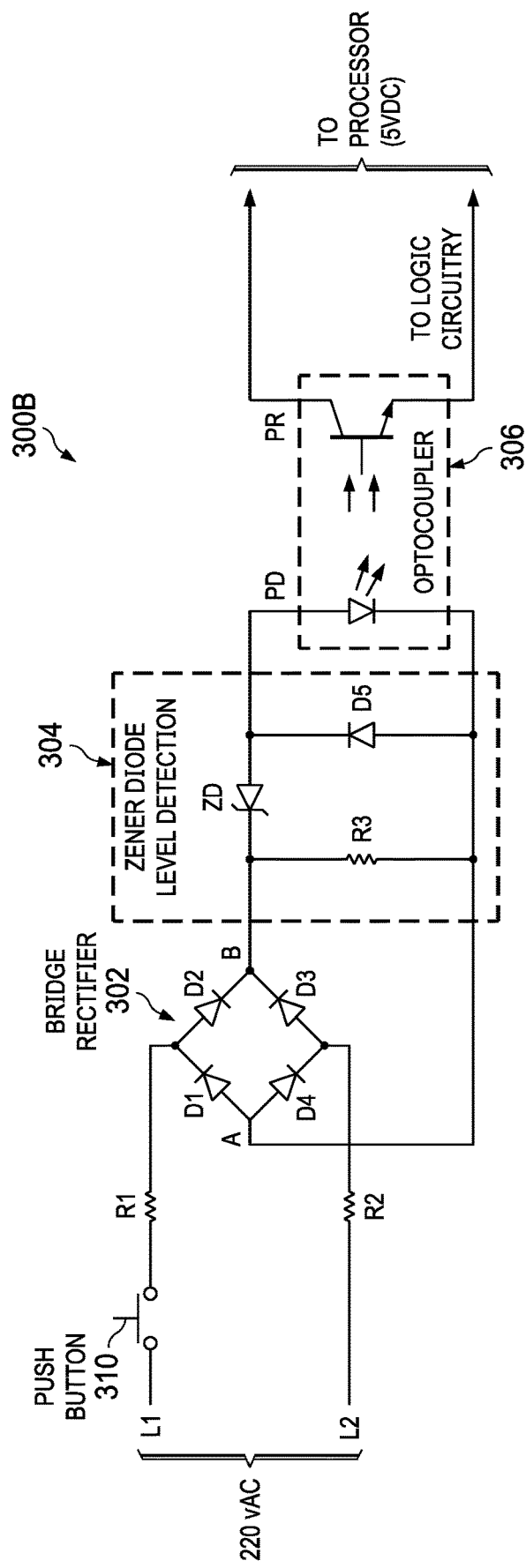
FIG. 3B depicts a circuit diagram of a binary input module according to the prior art.
Figure 4:
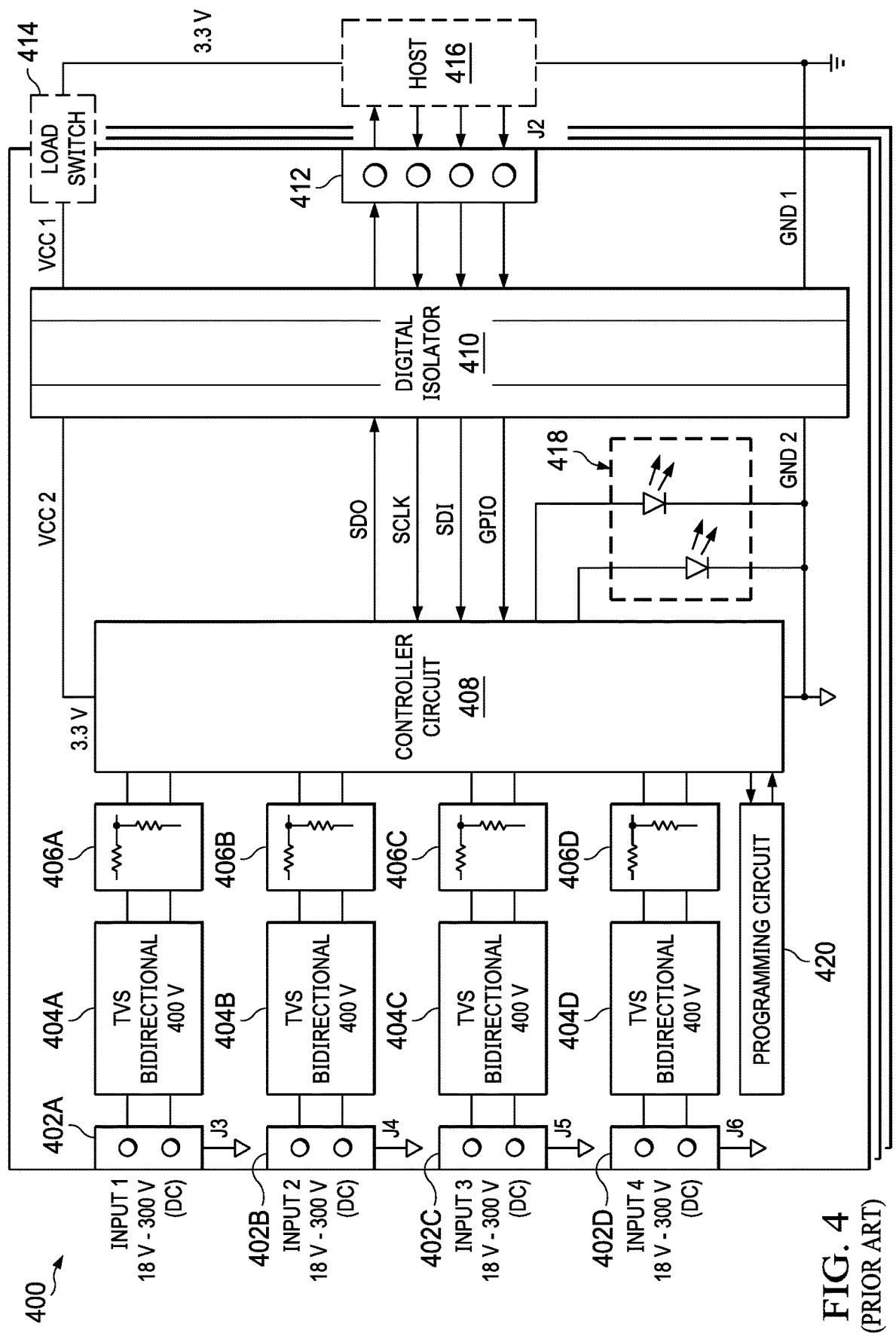
FIG. 4 depicts an implementation of a digital input module that provides greater granularity than the binary input module of FIG. 3 according to the prior art.

In order to emphasize the improvements provided by the disclosed circuit, FIGS. 3A, 3B and 4 are provided to illustrate the prior art circuits that are replaced by the disclosed circuit on an IC chip. FIG. 3A depicts a block diagram of a binary input module 300A according to the prior art, while FIG. 3B depicts a circuit diagram of binary input module 300B. In binary input module 300A, bridge rectifier 302 receives a differential pair of AC input signals on inputs L1, L2. After rectifying the AC current into DC current, the signal is passed to Zener diode level detection circuit 304, which determines whether the current is above or below a desired threshold. The results of the determination are sent across optocoupler 306 to logic circuit 308, which determines the status of the input signal and sends the status to a processor. The logic circuit 308 can also provide an input status indicator 309 such as a light to indicate whether the signal is above or below the threshold. Where it is not necessary to provide constant monitoring of the status, e.g. the status of a battery that only needs to be monitored periodically, a push button 310 can be utilized to close the circuit for the periodic monitoring, allowing the system to be off when not needed.

Binary input module 300B depicts an example embodiment in which the input voltage is 220V AC; two biasing resistors R1, R2 are provided to drop the voltage into bridge rectifier 302 to a lower level. Bridge rectifier 302 is formed of four diodes D1-D4. Diodes D1, D4 both have respective anodes coupled to point A, which is part of the Zener diode level detection circuit 304. The cathode of diode D1 and the anode of diode D2 are each coupled to input L1; the cathode of diode D4 and the anode of diode D3 are each coupled to input L2. The cathodes of diodes D2, D3 are each coupled to point B, which is also part of the Zener diode level detection circuit 304. Within Zener diode level detection circuit 304, Zener diode ZD is coupled in series with photodiode PD, which forms part of optocoupler 306, between points B and A. Resistor R3 and diode D5 are coupled in parallel with photodiode PD between points B and A, with one terminal of resistor R3 coupled to a point between point B and the cathode of Zener diode ZD while the cathode of diode D5 is coupled between the anode of Zener diode ZD and photodiode PD. This circuit arrangement ensures that a current only flows through photodiode PD when the current from point B to point A is above a threshold level determined by the value of Zener diode ZD; otherwise, the current flows from B to A only through resistor R3. Light emitted by photodiode PD crosses the isolation barrier of air and is received by photoreceptor PR. The reception of light on photoreceptor PR is an indication that the input voltage on L1, L2 is greater than the threshold value determined by Zener diode ZD. Depending on the desired response when the threshold value falls below the threshold value, the output of photoreceptor PR can be used to control the gate of either a pull-up transistor coupled to an upper voltage rail or a pull-down transistor coupled to a lower voltage rail (neither are specifically shown). With either connection, when the voltage on inputs L1, L2 drops below the threshold, the output of logic circuit 308 flips from a previous value. The output of logic circuit 308 is sent to a processor (not specifically shown) that determines a response to the change in value.

Implementations of the binary input module shown in FIGS. 3A and 3B have typically been provided using a circuit composed of discrete components, i.e., diodes, resistors, Zener diode and optocoupler, that is custom-built for each channel to be monitored. While this implementation is inexpensive, once the design is implemented in a circuit board that is designed for a given voltage level and a given threshold, the circuit board cannot be used for other voltage levels and/or thresholds. Instead, the circuit board must be rebuilt using components selected for the new voltage level or threshold. This means that any changes in the desired response from the circuit are both tedious and time consuming.

Other issues are also present. For example, customers have reported situations in which a channel built for a given voltage is accidently attached to an incorrect voltage or a DC voltage is coupled with the polarities accidently reversed. Since each channel is built to fit a specific voltage and threshold combination, such an incorrect coupling can damage the circuit. Additionally, in order to ensure that the circuit is working, a current must flow through the Zener diode ZD and photodiode PD, so that the input module consumes current whenever the input module is on, typically 1-10 mA.

FIG. 4 depicts an input module 400 that is integrated on an IC chip and provides improvements over the circuit of FIG. 3. Each channel of input module 400 receives a voltage, which can be between 18V and 300V DC. Although the specific configuration shown here is for DC input, other configurations of the chip can accept AC or DC. A pair of input pins 402 is provided to receive a differential signal for each channel, i.e., Input 1 through Input 4. Each pair of input pins 402 is coupled to a respective transient voltage suppressor (TVS) circuit 404. Since the inputs can extend across a large range, an external voltage divider 406 for each channel is coupled to the chip to provide a scaled voltage that is appropriate for use in the rest of the circuit, which in the embodiment shown is 3.3V. External voltage dividers 406 are coupled between TVS circuits 404 and controller circuit 408 to provide the scaled voltage. Controller circuit 408 includes a microcontroller unit as well as an analog-to-digital converter for each channel.

Depending on the configuration of this chip, input module 400 can provide either a binary status for each channel, or a digital value, which is passed to a host microcontroller 416. When configured to provide binary outputs, external LEDs 418 can be coupled to the chip to provide visual signals that reflect the status of the input signals. Whether input module 400 is configured for binary or digital outputs, the controller circuit 408 is coupled to digital isolator 410, which in turn is coupled to input/output pins 412. Controller circuit 408 provides a value for each channel on serial data output SDO to digital isolator 410, while three input channels provide a clock SCLK, serial data input SDI and general purpose I/O GPIO. Digital isolator 410 can utilize either capacitors or transformers to provide isolation between the input circuits and host microcontroller 416 and to pass both output values and input control information via input/output pins 412. An external load switch 414 can be coupled to the input module 400 as shown to protect against short conditions. Programming circuit 420 provides circuitry that can be used to program controller circuit 408. While input module 400 provides improvements over binary input modules 300A, 300B, input module 400 still needs external voltage dividers 406 to provide a voltage that the controller circuit 408 can accept. This means that physical components must still be changed in the circuit if there are changes to the inputs.

Figure 1A:
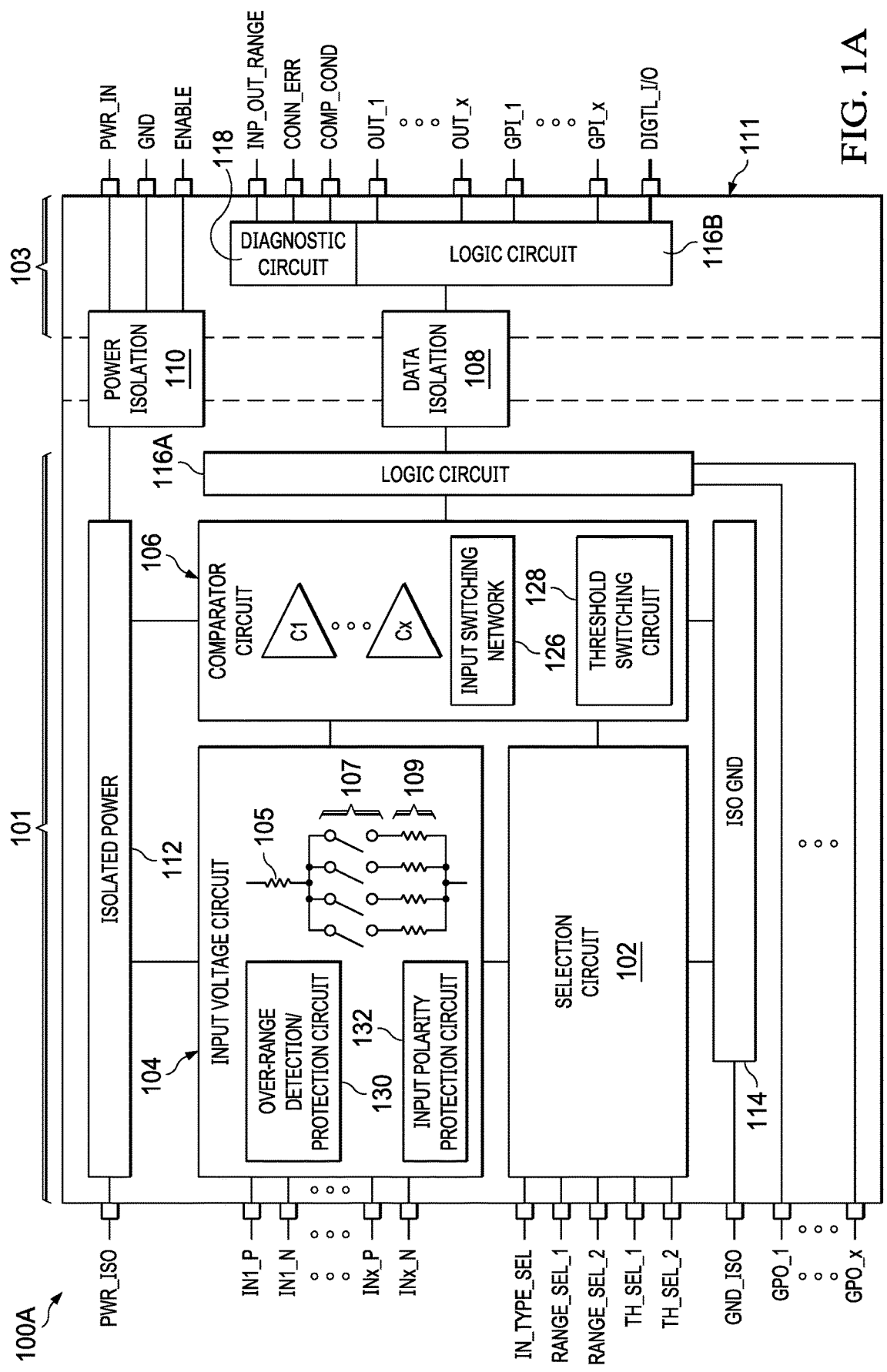
FIG. 1A depicts an example of a binary/digital input module implemented on an IC chip according to an embodiment of the disclosure.
Figure 1B:
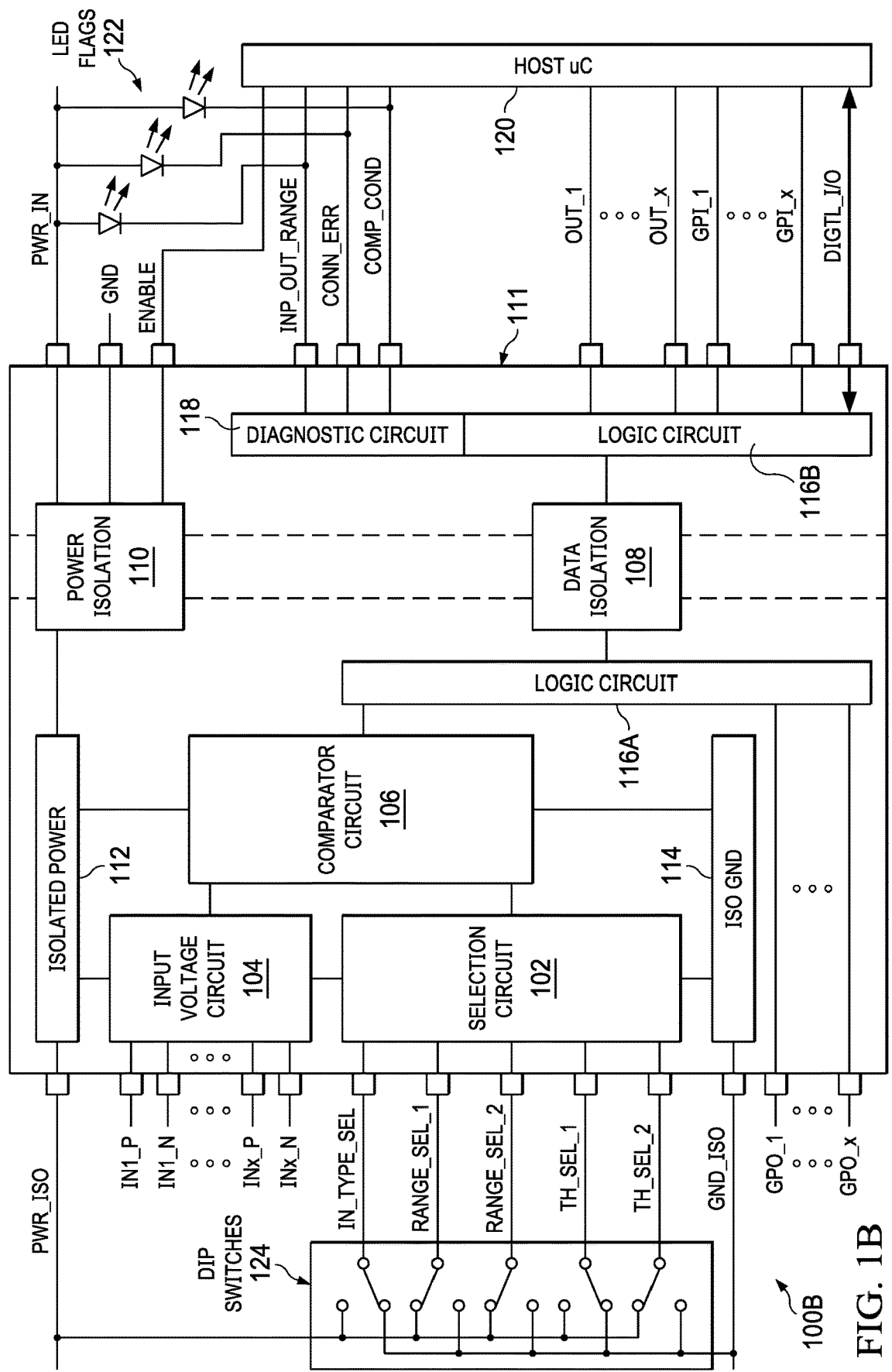
FIG. 1B depicts the binary/digital input module on an IC chip of FIG. 1A, with some of the user connections shown according to an embodiment of the disclosure.

FIGS. 1A and 1B depict an example of a binary/digital input module 100 implemented on an IC chip 111 according to an embodiment of the disclosure. Binary/digital input module 100A is shown in greater detail with regard to some of the circuits contained on the chip, while binary/digital input module 100B is simplified with respect to several circuits in order to provide room to show example external connections to the chip. Binary/digital input module 100A is divided into a status-monitoring region 101 and a host-side region 103, which are separated by an isolation region that includes both power isolation circuit 110 and data isolation circuit 108. Power isolation circuit 110 and data isolation circuit 108 are both digital isolation circuits that separate the two regions and can utilize either capacitors or transformers to provide the power and data across an isolation barrier that includes a dielectric material. Data isolation circuit 108 can also be referred to herein as digital isolation circuit for data 108 and power isolation circuit 110 can also be referred to as digital isolation circuit for power 110. In one embodiment, power isolation circuit 110 and data isolation circuit 108 both utilize capacitors for isolation.

Status-monitoring region 101 interfaces with the sensors and includes a number of pins for coupling to various sensors. In one embodiment, the inputs can be AC or DC and can carry voltages that range from 5V to 300V. A typical binary input module contains 8-16 input channels, although binary/digital input module 100A can contain more (e.g., 24, 32, 48, etc.) or fewer input channels (e.g., 1, 2, or 4). Status-monitoring region 101 includes selection circuit 102, input voltage circuit 104, comparator circuit 106, isolated power circuit 112, isolated ground circuit 114 and logic circuit 116A. Various pins are coupled to the circuits in status-monitoring region 101, e.g., an power output pin PWR_ISO that provides isolated power, a number of differential input pins IN1_P, IN1_N through INx_P, INx_N, where x denotes the number of input channels available on the chip, input type selection pin IN_TYPE_SEL, range select pins RANGE_SEL_1, RANGE_SEL_2, threshold select pins TH_SEL_1, TH_SEL_2, an isolated ground pin GND_ISO, and general purpose output pins GPO_1 through GPO_x. An output type selection pin is not specifically shown but can also be included.

Host-side region 103 interfaces with a processing unit such as a microprocessor and includes logic circuit 116B and diagnostic circuit 118. Pins coupled to the host-side region 103 include the sole input power pin PWR_IN, a ground pin GND, enable pin ENABLE, diagnostic pins that include input-out-of-range pin INP_OUT_RANGE, connection error pin CONN_ERR, and comparator condition pin COMP_COND, a binary output pin OUT_1 through OUT_x for each channel, a similar number of general purpose input pins GPI_1 through GPI_x, and a digital input/output interface DIGTL_I/O that can provide bi-directional transmission of instructions and data using any of Universal Asynchronous Receiver/Transmitter (UART), Serial Peripheral Interface (SPI) and Inter-Integrated Circuit (I2C) interfaces.

Three pins, i.e., power input pin PWR_IN, ground pin GND and enable pin ENABLE are coupled to power isolation circuit 110. The input power is transferred across power isolation circuit 110 to provide power to isolated power circuit 112 for distribution to the other circuits within status-monitoring region 101. In at least one embodiment, isolated power circuit 112 is also coupled to a power output pin PWR_ISO to provide power to an external chip as can be seen in FIG. 1B. Although not specifically shown, the power input pins PWR_IN and GND also provide power to the circuits in host-side region 103. Enable pin ENABLE is utilized to provide the ability to turn off one of more of the circuits of binary/digital input module 100A when monitoring is not necessary. This capability can be useful, for example, when the binary/digital input module 100A is utilized to monitor the status of batteries. This status needs to be determined periodically, but is generally not an item that must be monitored constantly. When binary/digital input module 100A is coupled to a host microprocessor 120, as shown in FIG. 1B, host microprocessor 120 can be programmed to enable binary/digital input module 100A when desired, provide a status report and then disable binary/digital input module 100A until time to check again.

By coupling the ENABLE pin to an external switch, an on-site technician can use the ENABLE pin to check the status whenever desired.

Within status-monitoring region 101, input voltage circuit 104 is coupled to a number of differential pairs of pins IN1_P and IN1_N through INx_P and INx_N. Each differential pair of pins provides an input channel that can be coupled to a differential pair of inputs from a sensor. For each channel, input voltage circuit includes a voltage sensor (not specifically shown) to determine the input voltage and a voltage divider. In one embodiment, each input voltage falls into one of four ranges that correspond to 24V, 48V, 110V and 220 V. The circuits of binary/digital input module 100A typically run on voltages in the range of 1.2-5.0 volts, so the input voltages must be scaled down appropriately so that the input voltages do not destroy binary/digital input module 100A.

The voltage divider in input voltage circuit 104 includes a first resistor 105 that is coupled to receive the input voltage and a plurality of selectable second resistors formed by second resistors 109 and switches 107. In one example, a first switch of switches 107 is closed to scale down an input voltage of 220V, while a second switch is closed to scale down an input voltage of 110V, a third switch is closed to scale down an input voltage of 48V and a fourth switch is closed to scale down an input voltage of 24V. There are several ways in which a determination is made as to which second resistor is utilized. In one embodiment, the voltage sensor (not specifically shown) determines the voltage range of the input coupled to an input channel and automatically determines the second resistor that will provide a desired voltage out of input voltage circuit 104. In another embodiment, the voltage range is received from selection circuit 102, to which input voltage circuit 104 is coupled. Input voltage circuit 104 is also coupled to comparator circuit 106, to which input voltage circuit 104 provides a scaled input voltage.

Input voltage circuit 104 several circuits designed to protect the chip from accidental damage to the chip when a voltage is incorrectly coupled to one of the differential pairs of input pins IN1_P, IN1_N through INx_P, INx_N. One example of an incorrect coupling occurs when the user has designated a particular differential pair of input pins to receive an input voltage of, for example, 48V, but a voltage of 110V or 220V is accidently coupled to the pins instead. An over-range detection/protection circuit 130 detects the over range coupling and blocks the voltage from reaching the rest of the circuit. Another example of incorrect coupling can occur when the input type selection indicates that the binary/digital input module is to be run in DC only mode and the polarity of the differential inputs are accidently reversed, such that the negative wire is coupled to the positive pin and the positive wire is coupled to the negative pin. An input polarity protection circuit 132 is provided as part of input voltage circuit 104 and blocks the positive voltage from reaching the circuit through the negative pin. In one embodiment, the input polarity protection circuit 132 is provided by a diode placed to block a positive voltage on the negative diode. The input polarity protection circuit 132 can also provide protection when the input type selection is set to DC only and an AC source is accidently coupled to the pins. When the input type selection pin IN_TYPE_SEL is set to AC/DC, the input polarity circuit 132 is bypassed.

Selection circuit 102 is coupled to receive the configuration settings from a user on a plurality of selection pins and to implement those selections in binary/digital input module 100. One of the plurality of selection pins is an input type selection pin IN_TYPE_SEL used to receive a selection of either DC only or AC/DC for the entire set of sensor inputs. A designation of DC only will cause the input polarity protection circuit 132 to be coupled to the negative input pins. Although not specifically shown in this implementation, an output type selection pin OUT_TYPE_SEL can also be implemented to allow a selection of either a binary or a digital output to be made using a switch.

For each input channel received at input voltage circuit 104, selection circuit 102 is coupled to an additional plurality of selection pins that include range selection pins for selecting the planned voltage range and threshold selection pins for selecting a threshold value for each differential pair of input pins. Although two range selection pins RANGE_SEL_1, RANGE_SEL_2 and two threshold selection pins TH_SEL_1, TH_SEL_2 are shown in this example embodiment, the actual number of selection pins depends on the number of choices that are to be provided. As mentioned previously, in one embodiment, the voltage ranges typically include 24V, 48V, 110V and 220V. Four separate settings are available for the two range selection pins RANGE_SEL_1 and RANGE_SEL_2; one example of the values associated with each selection is shown in Table 1:

TABLE 1

| | Maximum input voltage range | | | |
|---|---|---|---|---|
| | 24 V | 48 V | 110 V | 220 V |
| RANGE_SEL_1 | 0 | 0 | 1 | 1 |
| RANGE_SEL_2 | 0 | 1 | 0 | 1 |

Similarly, two threshold selection pins TH_SEL_1 and TH_SEL_2 can provide four selectable values for a threshold that is to be monitored by binary/digital input module 100A. The threshold can be expressed as a percentage of the desired input voltage; one example of assigned thresholds is shown in Table 2:

TABLE 2

| | As a % of input voltage range | | | |
|---|---|---|---|---|
| | 25% | 50% | 75% | 90% |
| TH_SEL_1 | 0 | 0 | 1 | 1 |
| TH_SEL_2 | 0 | 1 | 0 | 1 |

In general, selection circuit 102 can receive any selections, e.g., an input type selection, an output type selection, and a selected input range and threshold selection for each differential input pair, through two separate routes. In one embodiment, selection circuit 102 receives the input type selection, the output type selection, the input range selections and threshold selections using the input type selection pin IN_TYPE_SEL, output type selection pin OUT_TYPE_SEL, and corresponding range selection pins RANGE_SEL_1, RANGE_SEL_2 and threshold selection pins TH_SEL_1, TH_SEL_2. In one embodiment, selection circuit 102 receives the input type selection, the output type selection, the input range selections and the threshold selections from an input type selection register, an output type selection register, a corresponding range selection register and a corresponding threshold selection register, which collectively are selection registers. The selection registers can be written by microprocessor 120 through digital interface DIGTL_I/O and logic circuits 116A, 116B. In one embodiment, when no voltage range is provided to selection circuit, i.e., selection registers are not written to and the selection pins are left floating, the range can be automatically selected by input voltage circuit 104. If the IN_TYPE_SEL pin and the OUT_TYPE_SEL pin are left floating and no programming is provided for these pins, the default values in one embodiment are for AC/DC inputs and binary outputs. Once the selection pins are set or the selection registers are written, selection circuit 102 provides the selected range and input type to input voltage circuit 104 and provides the output type and a respective scaled threshold voltage corresponding to the selected range and threshold to a corresponding comparator in comparator circuit 106, to which selection circuit 102 is also coupled.

Comparator circuit 106 contains a comparator for each of the x differential pairs of inputs and can also include input switching network 126 and threshold switching circuit 128. Because binary/digital input module 100A utilizes comparators rather than Zener diodes and photodiodes, binary/digital input module 100A consumes much less current, i.e., 100 µA or less per channel. How the comparators receive an input voltage and provide an output changes depending on whether binary/digital input module 100A is configured for binary outputs or for digital outputs. When binary/digital input module 100A is configured for binary outputs, input switching network 126 and threshold switching circuit 128 are bypassed and each comparator C1-Cx in comparator circuit 106 is coupled to receive a respective scaled input voltage from input voltage circuit 104 and a scaled threshold voltage from selection circuit 102 and to compare the two voltages. The output value of each comparator C1-Cx is a binary value; when the input voltage crosses the selected threshold, the output value of the corresponding comparator will change from one binary value (i.e., low or high) to a second binary value (i.e., high or low). Given the one-to-one correspondence between inputs and comparators, all of the voltage input pairs can be checked simultaneously. The output values from the comparators are sent to logic circuit 116A, which is coupled to provide the comparator output values across data isolation 108 circuit to logic circuit 116B. From logic circuit 116B, the output values are each provided on a corresponding output pin OUT_1 through OUT-x. Alternatively or additionally, the output values from all of the comparators can be provided on request via digital interface DIGTL_I/O, which can communicate using e.g. UART/I2C/SPI.

When binary/digital input module 100A is configured for digital outputs, input switching network 126 and threshold switching circuit 128 are engaged such that multiple comparators are coupled to a single input voltage at a time, while each of the multiple comparators are coupled to receive a different threshold for the input range, turning the set of comparators into an analog-to-digital converter (ADC). Each input voltage can be checked and a digital value provided, but since there is no longer a one-to-one correspondence between the input pairs and the comparators necessary to provide an output, the input voltages are checked sequentially. In one example embodiment, a single input channel at a time is coupled to eight comparators to provide an output of eight bits to a host microprocessor 120 over the digital interface DIGTL_I/O.

Logic circuit 116A is coupled between comparator circuit 106 and data isolation circuit 108; similarly logic circuit 116B is coupled between data isolation circuit 108 and a number of pins, which include comparator output pins OUT_1 through OUT_x, general purpose inputs GPI_1 through GPI_x and digital interface DIGTL_I/O. Each of logic circuits 116A, 116B are composed of hardware logic gates and programmable registers; the programmable registers can be utilized to pass selection criteria, e.g., input type selection, output type selection, input voltage ranges and threshold values from a microcontroller, e.g., host microprocessor 120, to selection circuit 102 or to pass output values from comparator circuit 106 or the results from diagnostic testing back to the microcontroller.

Diagnostic circuit 118 includes a plurality of registers that are each associated with a specific error condition on the respective channel. In one embodiment, additional registers allow each respective channel to be coupled to a separate register for each error condition so that the identity of the location of the problem can be provided to the host microprocessor. Diagnostic circuit 118 also includes logic gates that respond to changes in the registers by changing the state of a respective diagnostic pin. A first signal is provided by the input out of range pin INP_OUT_RANGE when an input voltage on a differential pair of input pins IN1_P, IN1_N through INx_P, INx_N exceeds a voltage range that has been selected for that pair of input pins. This can occur, for example, when the user has selected an input range of, for example, 48V for a given differential pair of input pins, but connects a voltage of 110V or 220V to the differential pair. When this occurs, over-range detection/protection circuit 130 detects the voltage being received on the differential pair of pins and compares this voltage to the selected voltage provided by the selection circuit 102. When over-range detection/protection circuit 130 determines that the input voltage exceeds the selected voltage, over-range detection/protection circuit 130 writes an error value to an associated register. Any change to one of the registers associated with diagnostic circuit 118 is immediately passed through logic circuit 116A, data isolation circuit 108 and logic circuit 116B to diagnostic circuit 118, which sets a high value on the INP_OUT_RANGE pin. The same information can also be sent using the digital interface pin DIGTL_I/O if desired and can identify the differential pair of input pins on which the problem occurs. Typically, the INP_OUT_RANGE pin is coupled to one of LED flags 122 so that a technician on-site would quickly be alerted to the problem, while host microcontroller 120 is able to take other steps to manage the situation. As previously mentioned, input voltage circuit 104 will also take steps to prevent the additional voltage from harming internal circuits of the chip.

A second signal is provided by the connection error pin CONN_ERR when a current sensor (not specifically shown) in binary/digital input circuit 100 detects current consumption in status-monitoring region 101 of the chip that indicates a faulty condition. This condition can occur, for example, when two pins are accidently shorted together, causing a current within status-monitoring region 101. When this current is detected, binary/digital input module 100 causes a value to be written to an associated register to indicate the location of the excess current. Again, a change in the value of the register is passed through logic circuits 116A, 116B and data isolation circuit 108 and provided to diagnostic circuit 118, where the change in status is provided to host microprocessor 120 via connection error pin CONN_ERR and/or through digital interface DIGTL_I/O. The connection error pin CONN_ERR can also be coupled to receive inputs from input polarity protection circuit 132 and to provide an alert when a positive voltage is received on any of the negative input pins IN1_N through Inx_N.

A third signal can be provided during a testing phase that is initiated by a user or by host microprocessor 120 and indicates the status of the comparator circuit 106. When the testing phase is initiated, diagnostic circuit 118 initiates a test on each comparator C1 through Cx in comparator circuit 106 to determine whether the comparators are in working order. Diagnostic circuit 118 sends signals to each comparator C1 through Cx that are designed to cause the comparator to change values, i.e., for a given threshold voltage, each comparator is provided with signals in which the input voltage is less than the threshold voltage and signals in which the input voltage is greater than the threshold voltage. Testing can also include inputs via input switch network 126 and threshold switch network 128 to ensure that the entire circuit is operating properly. A first value on comparator condition pin COMP_COND indicates that the comparator(s) responded appropriately while a second value on comparator condition pin COMP_COND indicates that one or more comparator did not respond appropriately and is deemed damaged. The same information can also be provided on the digital interface DIGTL_I/O.

FIG. 1B provides a simplified version of the embodiment of FIG. 1 and illustrates one way in which the disclosed chip can be coupled to other circuits and devices. In this embodiment, the input type select pin IN_TYPE_SEL, the range pins IN_RANGE_SEL1, IN_RANGE_SEL2 and threshold select pins IN_TH_SEL1, IN_TH_SEL2 are coupled to switches in a Dual Inline Package (DIP) switch 124. Isolated power connections can be provided to DIP switch 124 using power output pin PWR_ISO and isolated ground pin GND_ISO so that each of the selection pins IN_TYPE_SEL, RANG_SEL_1, RANG_SEL_2, TH_SEL_1 and TH_SEL_2, as well as OUT_TYPE_SEL if available as a pin, can be coupled to either the upper voltage rail provided by power output pin PWR_ISO or the lower voltage rail provided by GND_ISO to provide binary inputs into selection circuit 102. The use of these binary inputs allows a user to change settings for the expected voltage range and threshold value for each input channel very quickly, i.e., by changing the position of a few switches.

On the host-side region 103 of binary/digital input module 100B, output pins OUT_1 through OUT_x, general purpose input pins GPI_1 through GPI_x, digital interface pin DIGTL_I/O and the diagnostic pins INP_OUT_RANGE, CONN_ERR, COMP_COND are each coupled to a host microprocessor 120. The ENABLE pin can either be coupled to host microprocessor 120 as shown, or the ENABLE pin can be coupled to a switch that can be turned on by an on-site technician to enable the circuit only when necessary. Host microprocessor 120 utilizes the information provided on either output pins OUT_1 through OUT_x or on the digital interface pin DIGTL_I/O to make decisions regarding the system being monitored. LED flags 122 can also be coupled to the three diagnostic pins INP_OUT_RANGE, CONN_ERR, COMP_COND to provide a visual indication when the system is either working properly or an error condition exists. In one embodiment, LED flags 122 can be replaced, for example, by auditory signals such as an alarm. When general purpose output pins GPO_1 through GPO_x are coupled to switches related to the sensors (not specifically shown), host microprocessor 120 can also change the setting of these switches by sending binary signals using general purpose input pins GPI_1 through GPI_x. These binary signals are passed through data isolation circuit 108 and logic circuits 116A and 116B and provided to general purpose output pins GPO_1 through GPO_x.

The disclosed binary/digital input module provides flexibility and protections that have never been made available to customers in an input module. Changes to the inputs, including input voltages, thresholds and even the type of voltages accepted, are now available simply by changing a few switches or programming appropriate registers. Not only are operations greatly simplified for the user, but protections are provided that block improper voltages and provide notifications of erroneous connections. Additionally, the ability is provided to check the binary/digital input module itself for errors and report upon request.

Binary/digital input module 100A has been described as providing a great deal of flexibility to a user. It should be understood that an embodiment of the disclosed binary/digital input module does not need to contain every possible element of flexibility to fall with the scope of the disclosed embodiments. Rather than providing a single chip that can be configured for either binary output or digital output, an embodiment of the disclosure can be provided with a preset configuration for only binary output or a preset configuration for only digital output. In one embodiment, inputs for programming each of the selectable characteristics, e.g., voltage range, threshold value, input signal type, output signal type are provided solely via pins without a capability for a digital interface. In one embodiment, inputs for programming each of the selectable characteristics are provided solely via a digital interface and no pins are provided for these elements. In one embodiment, the input voltage type is fixed as either DC only or else as AC/DC. Any combination of the disclosed improvements should be considered within the scope of the disclosed embodiments.

Although various embodiments have been shown and described in detail, the claims are not limited to any particular embodiment or example. None of the above Detailed Description should be read as implying that any particular component, element, step, act, or function is essential such that it must be included in the scope of the claims. Reference to an element in the singular is not intended to mean "one and only one" unless explicitly so stated, but rather "one or more." All structural and functional equivalents to the elements of the above-described embodiments that are known to those of ordinary skill in the art are expressly incorporated herein by reference and are intended to be encompassed by the present claims. Accordingly, those skilled in the art will recognize that the exemplary embodiments described herein can be practiced with various modifications and alterations within the spirit and scope of the claims appended below.

What is claimed is:

1. An integrated circuit comprising:
    (a) a status monitoring region including:
        (i) a selection circuit having range selection input pins, having threshold selection input pins, having a range selection output, a threshold selection output, and having a scaled threshold voltage output;
        (ii) an input voltage circuit including an input channel having a differential pair of input pins, having a range selection input coupled to the range selection output, having an input coupled to the threshold selection output, and having a scaled input voltage output;
        (iii) a comparator circuit having an input coupled to the scaled input voltage output, having an input coupled to the scaled threshold voltage output, and having a comparator output;
    (b) a data isolation circuit having an input coupled to the comparator output and having an isolation output; and
    (c) a host side region having a host side input coupled to the isolation output and a host side output pin.

2. The integrated circuit of claim 1 in which the input voltage circuit includes a voltage divider having a first resistor coupled to the input pins and a selected second resistor of second resistors, the voltage divider being coupled to the range selection input and being coupled to the scaled input voltage output.

3. The integrated circuit of claim 1 in which the selection circuit is coupled to selection registers that are coupled to the voltage range selection output and the threshold selection output, the host side region including logic circuits coupled to the selection registers responsive to inputs received on a digital interface pin.

4. The integrated circuit of claim 1 in which the selection circuit has an input type pin that designates one of DC only and AC/DC and to provide the input type to the input voltage circuit.

5. The integrated circuit of claim 1 in which the selection circuit has an output selection pin that designates one of binary output and digital output and provides the output selection to a comparator circuit that includes the respective comparator for the input channel.

6. The integrated circuit of claim 1 in which the output value is provided to an output pin associated with the input channel.

7. The integrated circuit of claim 1 in which the host side region provides output values as a digital signal to the host side output pin.

8. The integrated circuit of claim 7 in which the comparator circuit includes a comparator providing a binary value for the input channel.

9. The integrated circuit of claim 7 in which the comparator circuit includes a comparator providing a digital value for the input channel.

10. The integrated circuit of claim 1 including:
a power isolation circuit having an input power pin and a ground pin on the host-side region; and
an isolated power circuit coupled to the power isolation circuit and supplying power to the comparator circuit, the selection circuit, and the input voltage circuit.

11. The integrated circuit of claim 10 in which the isolated power circuit is coupled to a power output pin for coupling to an external device.

12. The integrated circuit of claim 10 in which the power isolation circuit is coupled to an enable pin adapted to receive an enable signal, the power isolation circuit being coupled to turn on power to the comparator circuit, the selection circuit and the input voltage circuit responsive to receiving the enable signal.

13. The integrated circuit of claim 12 in which the power isolation circuit is coupled to receive the enable signal via one of the enable pin and an enable register coupled to be written using programming over a digital interface.

14. The integrated circuit of claim 2, including a diagnostic circuit coupled to provide a first signal on a first diagnostic pin when the respective input voltage on a given differential pair of input pins is greater than the respective voltage range selection received by the selection circuit.

15. The integrated circuit of claim 14 in which the diagnostic circuit is further coupled to provide test values to the comparator during a testing phase initiated by a user and to provide a second signal on a second diagnostic pin when the comparator does not respond appropriately to the test values.

16. The integrated circuit of claim 13 including a current sensor coupled to detect current consumption associated with the inputs to the input voltage circuit and the selection circuit that indicates a faulty condition, the diagnostic circuit being further coupled to provide a third signal to a third diagnostic pin when a faulty condition is detected.

17. The integrated circuit in claim 16 in which the input voltage circuit includes circuitry to detect when a DC connection is coupled with reversed polarity, the diagnostic circuit being coupled to provide the third signal when the reversed polarity occurs.

18. The integrated circuit of claim 16 in which the input voltage circuit includes circuitry to detect when an AC voltage is coupled to a respective differential pair of pins when the input voltage circuit is configured for DC only inputs, the diagnostic circuit being coupled to provide the third signal when the AC voltage is detected.

19. The integrated circuit of claim 16 in which the diagnostic circuit is coupled to provide each of the first, second and third signals to the digital interface.

* * * * *